US008595656B2

(12) United States Patent
Aton et al.

(10) Patent No.: US 8,595,656 B2
(45) Date of Patent: Nov. 26, 2013

(54) MARKER LAYER TO FACILITATE MASK BUILD WITH INTERACTIVE LAYERS

(75) Inventors: Thomas J. Aton, Dallas, TX (US); Gregory C. Baldwin, Plano, TX (US); Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 12/909,034

(22) Filed: Oct. 21, 2010

(65) Prior Publication Data

US 2012/0102441 A1 Apr. 26, 2012

(51) Int. Cl.
*G06F 17/50* (2006.01)
(52) U.S. Cl.
USPC .................... 716/50; 716/53; 716/54; 716/55
(58) Field of Classification Search
USPC ........................................................ 716/50
See application file for complete search history.

(56) References Cited

U.S. PATENT DOCUMENTS

| 2009/0125864 A1* | 5/2009 | Aton et al. ................ 716/19 |
| 2009/0125865 A1* | 5/2009 | Aton et al. ................ 716/19 |
| 2009/0178013 A1* | 7/2009 | Wang et al. ................ 716/2 |

OTHER PUBLICATIONS

Webster's New College Dictionary, Copyright 2005 by Wiley Publishing, Inc. Cleaveland, Ohio, pp. 64 and 379.

* cited by examiner

*Primary Examiner* — Vuthe Siek
*Assistant Examiner* — Eric Lee
(74) *Attorney, Agent, or Firm* — Alan A. R. Cooper; W. James Brady III; Frederick J. Telecky, Jr.

(57) ABSTRACT

A mask build system includes a program for configuring mask layers and a fabrication site for compiling configured mask layers. The system includes at least one database configured by a system processor, the database comprising drawn layers for fabricating reticles of a semiconductor device; and a marker layer configured to define layer dependent features, the marker layer handed off with that part of the at least one database which will support subsequent layers of the database without altering flow of mask build at the fabrication site.

24 Claims, 3 Drawing Sheets

MARKER LAYER TO FACILITATE MASK BUILD WITH INTERACTIVE LAYERS

FIELD

This invention relates generally to semiconductor fabrication and more particularly, to a mask build system having a pattern marker layer utilized where layer dependencies need to be taken into account in the mask build. While not intending to be limiting, the disclosure describes, by way of example, the marker pattern layer in a front end of line (FEOL) database, where the marker layer can be used as a placeholder for a final contact pattern reticle designed in a back end of line (BEOL) database.

BACKGROUND

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a photomask, or "reticle", includes a semiconductor circuit layout pattern typically formed of opaque chrome, on a transparent glass (typically $SiO_2$) substrate. Each layer of the semiconductor circuit can be formed using one or more reticles, the arrangement and content of each reticle being configured and stored in a database. The content of the database is provided (e.g. "handed off") to a fabrication site for fabrication of the semiconductor device according to the content of the database.

To improve the cycle time to get a new semiconductor device out of fabrication, a design team frequently breaks the database handoff into two parts. The first database part can include the drawn base layers and the second database part can include drawn programmation layers. Base layers are the layers needed to build Front End of Line (FEOL) reticles up through but not including a contact pattern (CONT). Programmation layers are the layers that define Back End of Line (BEOL) reticles (layers above CONT). This allows the reticle build and subsequent lead lot to begin before the entire database is handed off to the factory. The reason it is desired to hand off the final CONT drawn layer with the programmation patterns is that CONT is one of the drawn layers modified to finalize a database. CONT placements are modulated in Engineering Change Order (ECO) library macros to change the functionality and/or timing of logic designs. These ECO cells are generally the last cells to be finalized in a design. Up until the 90 nm flow, there was minimal interaction between the drawn layers that affected the build of FEOL versus BEOL reticles. It will be appreciated that the use of the CONT for ECO's is optional, and not mandatory. The present embodiments are directed to those situations where CONT is used for the ECO's.

However, beginning at 90 nm, the CONT drawn layer not only affects the CONT reticle, but it also strongly influences the Optical Proximity Correction (OPC) that needs to be applied to a polysilicon "POLY" layer reticle. Because the drawn POLY layer, which defines the GATE reticle, is handed off with the base layers and the final CONT pattern is handed off with the programmation layers, the POLY reticle cannot be manufactured until the programmation layers are handed off which is too late in the manufacturing flow.

Accordingly, a need exists to define a process and flow in a system which allows accommodation of layer dependencies without affecting the flow of mask build. The disclosure uses the example where the final CONT drawn level to be handed off with the programmation layers but include enough information about CONT in the base drawn layers to build reticles which are affected by the drawn CONT level.

BRIEF SUMMARY

These and other problems are generally solved or circumvented, and technical advantages are generally achieved, by preferred exemplary embodiments herein which disclose a mask build system including a program for configuring mask layers and a fabrication site for compiling configured mask layers. The mask build system can include a base database configured by a system processor, the base database comprising drawn layers for fabricating front end of line (FEOL) reticles up through and including a contact pattern marker layer configured to define all potential contact locations of a fabricated semiconductor device; and a programmation database configured by the system processor, the programmation database comprising drawn layers for fabricating back end of line (BEOL) reticles including a final contact pattern layer reticle.

Further exemplary embodiments disclose a front end of line database configured by a processor in a mask build system. The front end of line database can include a POLY layer defining a GATE reticle; and a contact pattern marker layer configured to define all potential contact locations of a fabricated semiconductor device.

Still further exemplary embodiments disclose a method of facilitating mask build. The method can include configuring, by a processor, a base structure database, the base structure database comprising layers for building front end of line (FEOL) reticles up through and including a contact pattern marker layer, the contact pattern marker layer configured to define all potential contact locations of a fabricated semiconductor device; and configuring, by a processor, a programmation database corresponding to the semiconductor device of the base structure database, the programmation database comprising layers for building back end of line (BEOL) reticles including a final contact pattern layer reticle.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
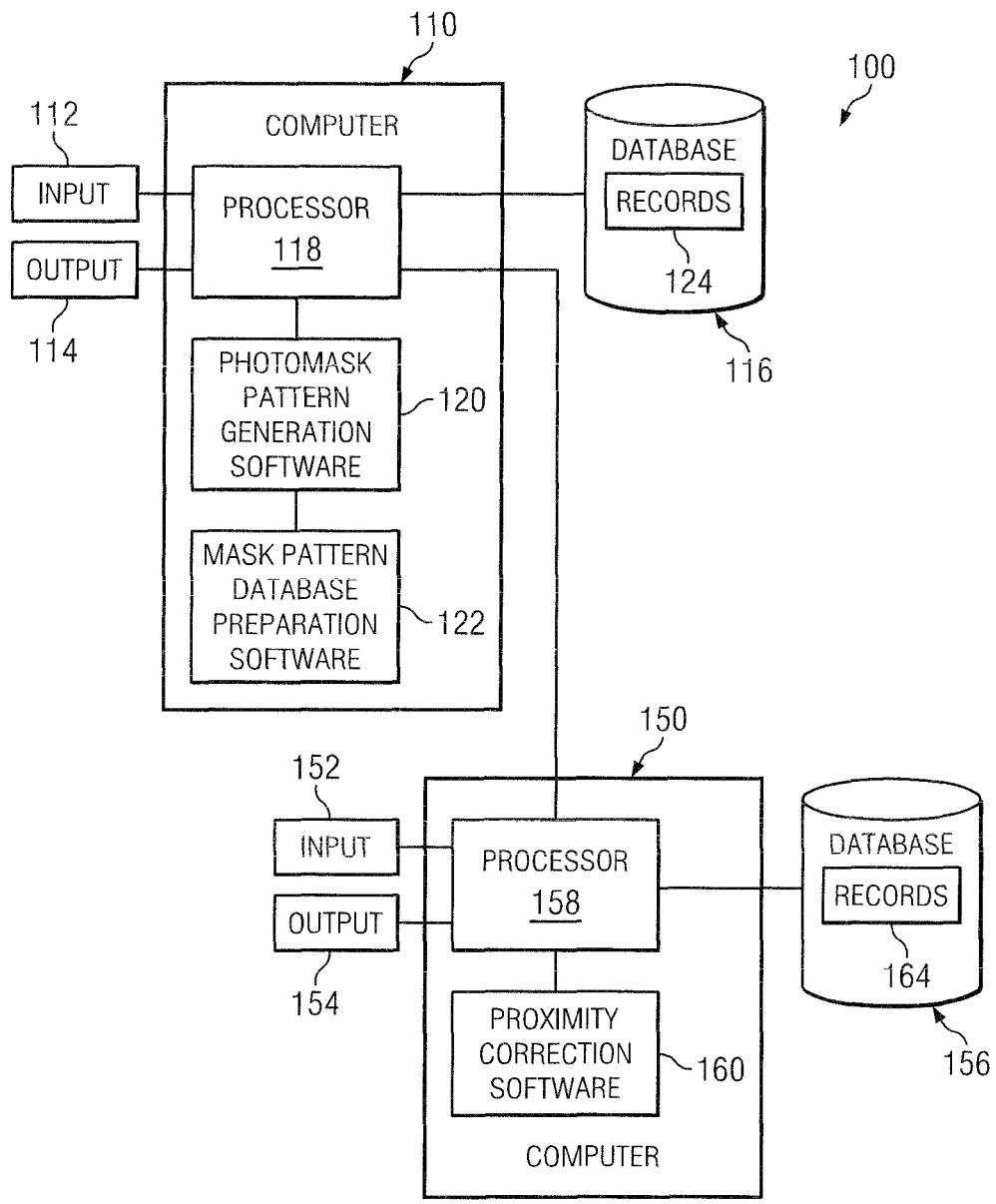
FIG. 1 illustrates a system for forming a photomask pattern, according to an embodiment of the present disclosure.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein, the term "POLYCONT_OFFSET" refers to a contact at least partially offset from POLY, i.e. having overhang with respect to POLY.

As used herein, the term "GHOSTPOLY" refers to a form of dummy POLY that may or may not appear in a final wafer result, but is present in the resist pattern used to transfer the POLY pattern to a wafer.

As used herein, the term "ACTIVE" refers to the source/drains or diffusion regions into which the POLY/GATE pattern is used to make active MOS transistors.

According to embodiments, layer dependencies can be taken into account using a marker layer, without affecting a flow of a mask build. For example, a final CONT drawn layer can be handed off with the programmation layers and include enough information about the final CONT in the base drawn layers to build reticles which can be used by the final drawn CONT layer. This is accomplished herein by adding a drawn contact pattern marker layer (CONT_L8R), which identifies all of the locations a potential contact pattern (CONT) could exist which would be handed off with the base layers. This drawn contact pattern marker layer CONT_L8R, when added to the final drawn CONT layer, allows the OPC to be included on the GATE reticle even though the final CONT pattern was not available until the programmation database handoff.

It will be appreciated that the following examples can be implemented such that the contact pattern marker layer CONT_L8R can be used to modulate more than one mask in addition to the POLY mask. For example, the contact pattern marker layer can be used to modulate any or all of an NFET strain (PMDL1) mask layer, a PFET strain (PMDL2) mask layer, and an active diffusion (OD) mask layer. Further, although the specific examples are to FEOL-BEOL processes, it will be appreciated that the contact pattern marker layer disclosed can be implemented in either of a FEOL-FEOL, and BEOL-BEOL type of application, and as such is intended to be included in the scope of the following.

FIG. 1 illustrates a system 100 for forming a photomask pattern, according to an exemplary embodiment of the present disclosure. System 100 includes a first computer 110 and a second computer 150. Input devices 112, 152 and output devices 114, 154 are respectively coupled to computers 110 and 150, which are in turn respectively coupled to databases 116, 156, as shown in FIG. 1. Input devices 112, 152 can include, for example, a keyboard, a mouse, a network, and/or any other system or device suitable for inputting and manipulating data to the respective computers 110 and 150. Output devices 114, 154 can include, for example, a display, a printer, and/or any other device suitable for presenting data from the respective computers 110 and 150.

Computers 110 and 150 can be personal computers, workstations, networked computers, or any other suitable processing platform. Computers 110 and 150 can include processors 118, 158, as shown in FIG. 1. The processor 118, 158 can be implemented using at least one microprocessor from vendors such as Intel, Advanced Micro Devices, Transmeta, IBM, or other circuit manufacturers. In addition, computer 110 can include photomask pattern generation software 120 and mask pattern database preparation software 122. Computer 150 can include proximity correction software 160.

Photomask pattern generation software 120, mask pattern database preparation software 122, and proximity correction software 160 can exist as software that comprises computer readable program instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 118 can be configured to control the flow of data between input device 112, output device 114, database 116, photomask pattern generation software 120, and mask pattern database preparation software 122. Photomask pattern generation software 120 can receive descriptions of integrated circuit device features from database 116 and generate photomask patterns. Mask pattern database preparation software 122 can prepare a mask pattern database, which can include mask pattern data generated by photomask pattern generation software 120. While an embodiment of FIG. 1 illustrates the photomask pattern generation software 120 and the mask pattern database preparation software 122 separately, the photomask pattern generation and mask pattern database preparation can be carried out using any suitable computer program design employing one or more computers. For example, the photomask pattern generation and mask pattern database preparation can both be performed using a single set of code on a single computer, or by separate sets of code located on different computers. One of ordinary skill in the art would readily be able to program computer readable code to implement the disclosed processes given the teachings of the present disclosure. Once the mask pattern database is prepared, processor 118 can transfer the mask pattern database to computer 150 for further processing. The computers 110, 150 can be coupled together over a network (not shown). The network can be a local area network, a wide area network or a combination thereof. The communication protocol between the computers 110, 150 can be implemented with IEEE802.x, token ring, or any other network protocol.

Processor 158 of computer 150 can be configured to control the flow of data between input device 152, output device 154, database 156, and proximity correction software 160. Proximity correction software 160 can be configured to process the mask pattern data received from computer 150. Specifically, proximity correction software 160 performs a proximity correction process that corrects the mask pattern data for proximity effects.

Databases 116, 156 can comprise any suitable system for storing data. Databases 116, 156 can be implemented using mask database technologies employing file formats such as GDSII or Oasis or any other similar database formats. Database 116 can store records 124 (data or files) that comprise data associated with the integrated circuit device features and the photomask patterns to be generated, such as data from a design database and mask pattern database, as will be described in greater detail below. Database 156 can store records 164 (data or files) that comprise data associated with the proximity correction process, such as, for example, the mask pattern database transferred from computer 110.

FIG. 2 illustrates a flow diagram 200 of one embodiment of a process for making photomasks according to the present disclosure. It should be readily apparent to those of ordinary skill in the art that the flow diagram 200 depicted in FIG. 2 represents a generalized schematic illustration and that other steps can be added or existing steps can be removed or modified.

As shown in FIG. 2, the process generally includes configuring a base structure database, as described in block 220; and configuring a programmation database corresponding to the semiconductor device of the base structure database, as described in block 240.

As shown in block 210 of FIG. 2, the process begins by receiving data from a design database. The design database contains data describing at least a portion of an integrated circuit design layout, referred to as the "drawn" pattern. Techniques for forming design databases are well known in the art.

After the design database is received, mask makers use the design data to make one or more photomasks that can be used to implement the integrated circuit design described in the design database. It will be appreciated in FIG. 2 and the following figures that intermediate functional, protective, and similar layers, including vias, etc. are not shown for purposes of clarity. It is understood that these intermediate layers can be included in an integrated circuit design as known in the art. As shown at block 220, the base structure database can include layers for building front end of line (FEOL) reticles up through and including a contact pattern marker layer (CONT_L8R). The contact pattern marker layer can be configured to define all potential contact locations of a fabricated semiconductor device.

As shown at block 230, the base structure database can be handed off to fabricators, in order to generate reticles consistent with the base structure database. The base structure includes layers for building the FEOL reticles up through and including the contact pattern marker layer described. The contact pattern marker layer is configured to define all potential contact locations of a fabricated semiconductor device.

The base structure database can include a drawn polysilicon (POLY) layer, the drawn POLY layer defining a GATE reticle. The drawn POLY layer can further include optical proximity correction (OPC).

The programmation database can correspond to the semiconductor device of the base structure database. The programmation database can include layers for building back end of line (BEOL) reticles, including a final contact pattern layer reticle (CONT).

As shown at block 250, FEOL reticles can be built from the FEOL base structure database, prior to hand off and/or build of reticles from the programmation database in a subsequent step.

As depicted in block 260, the base structure database can be handed off to a fabricator, to initiate reticle fabrication prior to supplying the programmation database to the fabricator. Consistent with block 250, the programmation database can be handed off to the fabrication site subsequent to hand off and/or fabrication of that portion of a semiconductor device corresponding to the base database (FEOL). It will be appreciated that the FEOL reticles may or may not be built prior to hand off of the BEOL reticles of the programmation database to the fabricators.

As shown in block 270, reticles are built from the BEOL programmation database. Because of the steps shown and described, the contact pattern marker layer (CONT_L8R), when added to the final contact pattern layer reticle, enables the OPC due to the contact pattern marker layer, to be included in the GATE reticle upon fabrication of the final contact pattern obtained from the programmation database.

Once the preparation of the mask data is complete, the data can then be used to write the photomasks as shown at block 280. Often the mask pattern data is sent to a mask shop, where actual production of the photomasks occurs. Any suitable technique for writing the photomask may be employed. Suitable techniques for writing masks are well known in the art.

In accordance with the above, a placement of potential contact patterns can be controlled in the contact pattern marker layer (CONT_L8R) according to predetermined design rules and in order to accommodate a final contact pattern CONT.

The predetermined design rules can include at least one of CONT_L8R minimum size, space to CONT that is overhanging POLY, maximum overhang of POLY, POLY minimum overhang of CONT_L8R, CONT max overhang CONT_L8R, and contacts that are later placed in CONT_L8R locations must pass all CONT rules including space and size.

In one embodiment, the process of configuring the FEOL base structure database described in block 220 can be performed on a single computer, such as computer 110 of FIG. 1. The FEOL base structure database can then be transferred to a second computer, such as computer 150 of FIG. 1, to perform other operations, including configuring the BEOL programmation database described at block 240. In other embodiments, at least some of the process for configuring the FEOL base structure database can be carried out on the same computer used to configure the BEOL programmation database. In yet other embodiments, the processes depicted in FIG. 2, can be performed on a single computer.

Figure 2A:
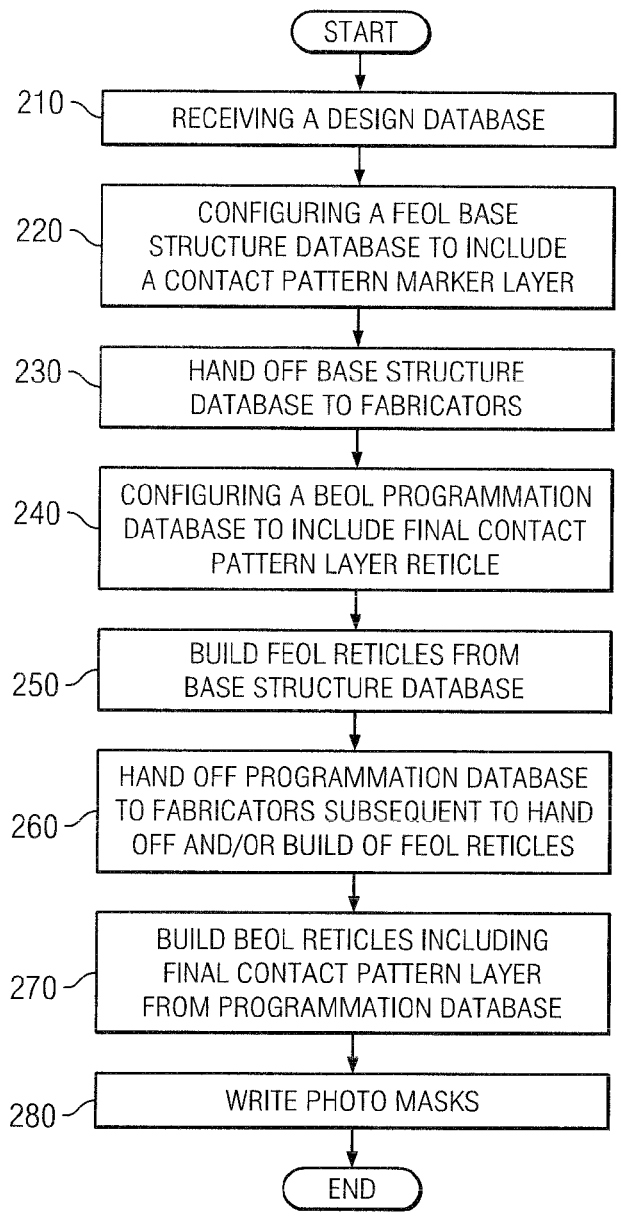
FIGS. 2A and 2B illustrate flow diagrams of processes for making photomasks, according to an embodiment of the present disclosure.
Figure 2B:
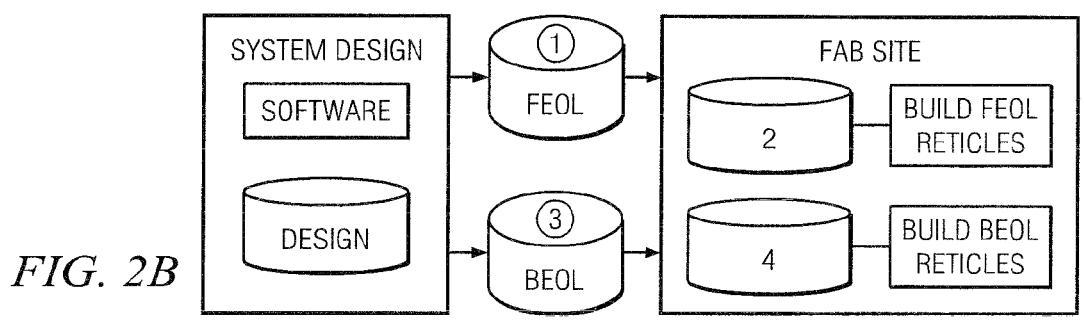

A generalized flow between system design and the fabrication site is depicted in FIG. 2B, and is provided to conceptualize the flow chart of FIG. 2A in the context of system design and the fabrication site. It should be readily apparent to those of ordinary skill in the art that the diagram depicted in FIG. 2B represents a generalized schematic illustration and that other steps can be added or existing steps can be removed or modified.

In general, at the system design site, a fabrication design team uses a software program to generate design for a silicon device output at a fabrication site. It will be appreciated that the sites may be common or separate as known in the art. At the system design, the database is separated into two parts, including the base levels needed to build the FEOL reticles up through but not including the contact pattern layer, and the programmation layers that define the BEOL reticles (layers above the contact pattern layer). This allows reticle build and subsequent lead lot start to begin before the entire database is handed off to the factory. In the depiction of FIG. 2B and according to the present disclosure, the FEOL database is designed and labeled as number 1 in the figure. Subsequent to its design at number 1, the FEOL database is handed off at number 2 to the fabrication site, even prior to configuration of the BEOL database. Reticle build from the FEOL database is shown adjacent the FEOL database 2. The configuration, e.g. design, of the BEOL database is indicated at number 3 and the handoff of the BEOL database to the fabrication site is indicated at number 4. Reticle build from the BEOL database is shown adjacent the BEOL database 4. It will be appreciated that the build of the FEOL reticles can occur either prior to or concurrently with the configuration (3) and hand off (4) of the BEOL to the fabrication site. In keeping with the description in FIG. 2A, the FEOL reticles include the contact pattern marker layer and the BEOL reticles include the final contact pattern layer, such that the contact pattern marker layer, when added to the final contact pattern layer, allows optical proximity correction because the final contact patter layer is included on the POLY/GATE reticle even though the final contact pattern was not available until the BEOL database handoff.

The process of FIGS. 2A and 2B may be employed for making any type of photomasks, including phase shift masks and trim masks for use in a phase shift process (altPSM), binary masks, embedded attenuated phase shift masks, hard phase shift masks, double-dipole exposure masks, or any other suitable type of mask. The embodiments of the present application are not intended to be limited to the processes illustrated in FIGS. 2A and 2B, and other additional processes, such as data verification procedures, which are not shown in the flow diagrams of FIGS. 2A and 2B, may also be employed.

The configuring and generation of the FEOL base structure database and the BEOL programmation database in blocks 220 and 240 can be done by the photomask pattern generation software 120, which outputs the FEOL and BEOL photomask patterns. The FEOL photomask patterns can be corrected for proximity effects in a subsequent proximity correction process (not shown).

The photomask patterns can be formed by employing various resolution enhancement techniques, which can be programmed into the photomask pattern generation software 120 and executed by the processor 118. In some embodiments, the resolution enhancement techniques may include redrawing portions of the drawn pattern. For example, in some instances it may be determined that the drawn pattern may be difficult or impossible to pattern given the constraints of the lithography system being employed. In such instances, it may be desirable to redraw the design data pattern to account for these lithography restraints, while achieving the basic circuit functionality intended by the drawn pattern.

The term "contact" is sometimes referred to in the art of integrated circuits as being limited to electrical connecting structures between metal 1 and the device structures formed on the wafer (e.g., contacts made from metal 1 to gates or active regions). However, for purposes of this disclosure, the term "contact" is defined to include any electrical connection made between upper and lower levels of a device, including contacts formed between metal 1 and the device structures on the wafer, as well as metal to metal contacts formed between upper level metallization structures (often referred to as vias or via fill). The contacts can comprise any suitable electrical conducting material, such as doped polysilicon or metal.

Figure 3A:
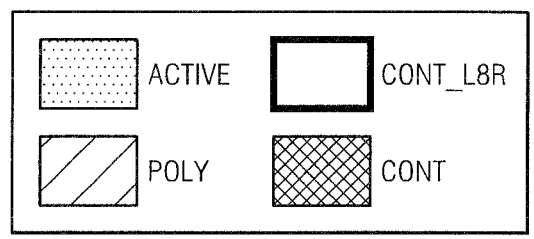
FIGS. 3A and 3B illustrate drawn circuit layouts, according to an embodiment of the present disclosure.
Figure 3A:
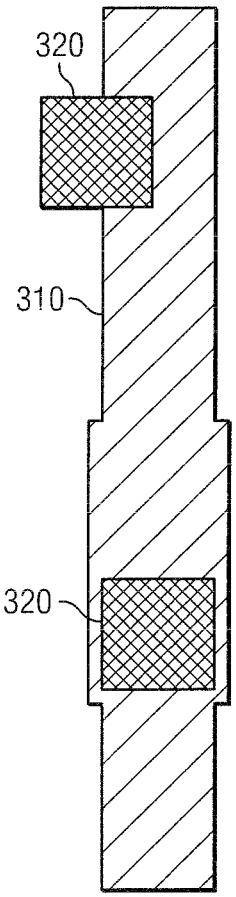
Figure 3B:
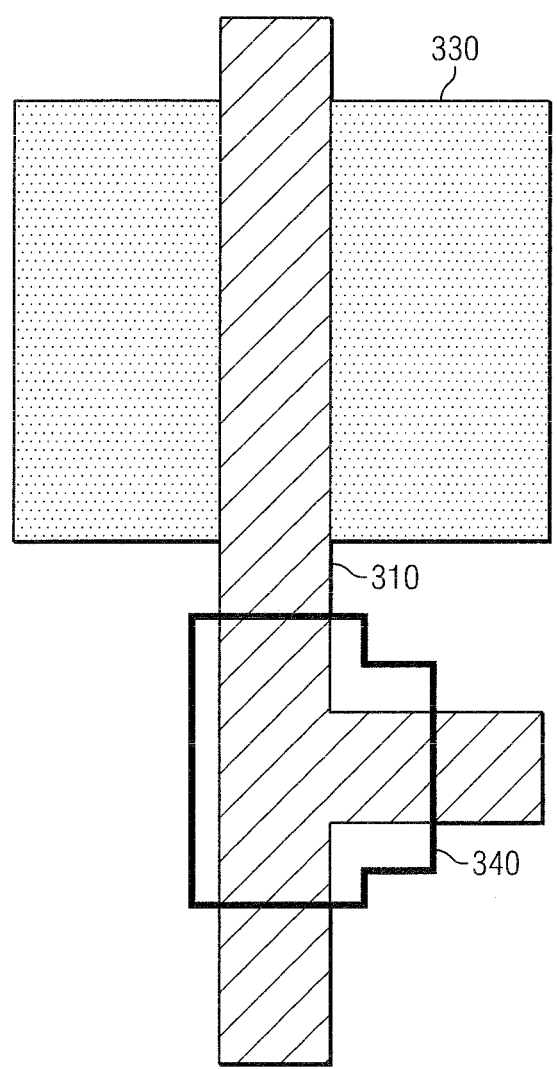

FIG. 3A illustrates a drawn circuit layout 300A corresponding to back end of line (BEOL) reticles and FIG. 3B illustrates a drawn circuit layout 300B corresponding to front end of line (FEOL) reticles, consistent with embodiments of the present disclosure. It should be readily apparent to those skilled in the art that FIG. 3 is exemplary and that other components can be added or existing components can be removed or modified without departing from the scope of the exemplary embodiments.

In exemplary embodiments, the circuit layout 300A can include metal layers (not shown) and a final contact (CONT) pattern layer 320. It will be appreciated that the embodiments herein is always used in the FEOL layer, such that the POLY layer 310 depicted in FIG. 3A is only for purposes of referencing exemplary locations of the CONT pattern layers 320. Although not shown in detail, the design of FIG. 3A can include all layers for fabricating BEOL reticles.

In exemplary embodiments, the circuit layout 300B can include a POLY layer 310 an active region 330, and a contact pattern marker layer (CONT_L8R) 340. The POLY layer can include optical proximity correction (OPC) (not shown). It will be appreciated, then, that the structure of FIG. 3B can include all FEOL reticles up through and including the contact pattern marker layer 340.

The POLY layer 310 can define a gate reticle and the contact pattern marker layer 340 is configured to define all potential contact locations of a fabricated semiconductor device. With the exemplary configurations of FIGS. 3A and 3B, the layers in the back end of line reticles include the final contact pattern layer reticle 320, and can be submitted for fabrication subsequent to the front end of line configuration of FIG. 3B.

It will be appreciated that three scenarios can occur. In a first situation, some CONTs can be actually present in the database (for example over AVTIVE and in some cases over POLY) and could not be later moved if over POLY without requiring re-OPC of the POLY mask. In a second situation, some CONTs are over POLY but enclosed by CONT_L8R and hence could be moved later without requiring re-OPC of the POLY mask. In a third situation, some empty CONT_L8R regions can be drawn where the POLY OPC would act to prepare the POLY mask to receive a possible later addition of a CONT anywhere within CONT_L8R, again without requiring re-OPC of the POLY mask. Situations 2 and 3 are exemplified in the present embodiments, generalized to where layer N+1 will influence the OPC of layer N and the database is separated between N and N+1.

The exemplary configurations can control a placement of potential contact patterns in the contact pattern marker layer 340 according to predetermined design rules and in order to accommodate a final contact pattern 320. The predetermined design rules can include CONT_L8R minimum size, space to CONT that is overhanging POLY, maximum overhang of POLY, POLY minimum overhang of CONT_L8R, CONT max overhang CONT_L8R, and contacts that are later placed in CONT_L8R locations must pass all CONT rules including space and size.

It will be ultimately appreciated that the exemplary embodiments herein are for the purpose of describing the generic embodiment in which layer dependencies can be taken into account, using a marker layer, without affecting a flow of mask pattern build.

While the invention has been described with reference to the exemplary embodiments thereof, those skilled in the art will be able to make various modifications to the described embodiments without departing from the true spirit and scope. The terms and descriptions used herein are set forth by way of illustration and are not meant as limitations. In particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising". As used herein, the term "one or more of" with respect to a listing of items such as, for example, A and B, means A alone, B alone, or A and B.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A mask build system comprising a program for configuring mask layers and a fabrication site for compiling configured mask layers, the system comprising:
   at least one database configured by a system processor, the database comprising drawn layers for fabricating reticles of a semiconductor device;
   the drawn layers including at least:
     a) a first drawn layer denoting at least one substantially planar interconnect;
     b) a second drawn layer denoting at least one substantially planar interconnect;
     c) a third drawn layer denoting holes to connect between the first drawn interconnect layer and the second drawn interconnect layer, the positions and shapes of geometries of the hole layer being used to affect the preparation of the mask data for the first interconnect layer; and
   a drawn marker layer explicitly selecting and defining all sections of the first drawn interconnect layer which the mask build system is to prepare to correctly handle all design-rule-correct positionings of all the holes as can be drawn within the drawn marker layer.

2. The mask build system of claim 1, wherein the marker layer is configured to modulate at least one of an NFET strain (PMDL1) mask, a PFET strain (PMDL2), an active diffusion (OD) mask, and a POLY mask.

3. The mask build system of claim 1, further comprising a program for configuring mask layers and a fabrication site for compiling configured mask layers, the mask build system further comprising:
   a base database configured by a system processor, the base database comprising drawn layers for fabricating front end of line (FEOL) reticles up through and including a contact pattern marker layer configured to define all design-rule-correct potential contact locations of a fabricated semiconductor device; and
   a programmation database configured by the system processor, the programmation database comprising drawn layers for fabricating back end of line (BEOL) reticles including a final contact pattern layer reticle.

4. The system of claim 3, wherein the base database comprises a drawn POLY layer defining a GATE reticle.

5. The system of claim 4, wherein the drawn POLY layer comprises optical proximity correction (OPC).

6. The system of claim 3, wherein the fabrication site sequentially receives the base database and the programmation database for sequential fabrication of FEOL reticles and BEOL reticles.

7. The system of claim 3, wherein the marker layer, when added to the final contact pattern layer reticle, enables the OPC due to the contact pattern marker layer, to be included in the GATE reticle upon fabrication of the final contact pattern obtained from the programmation database.

8. A database configured by a processor in a mask build system, the database embodied on a non-transitory medium, wherein contents of the database employed by a fab site, the database comprising:
   a plurality of drawn layers defining corresponding reticles; and
   the drawn layers including at least:
     a) a first drawn layer denoting at least one substantially planar interconnect;
     b) a second drawn layer denoting at least one substantially planar interconnect;
     c) a third drawn layer denoting holes to connect between the first drawn interconnect layer and the second drawn interconnect layer, the positions and shapes of geometries of the hole layer being used to affect the preparation of the mask data for the first interconnect layer; and
     d) a drawn marker explicitly selecting and defining all sections of the first drawn interconnect layer which the mask build system is to prepare to correctly handle all design-rule-correct positionings of all the holes as can be drawn within the drawn marker layer, and
   the fab site to build said corresponding reticles for a fabricated semiconductor device.

9. The database of claim 8, wherein the marker layer is configured to modulate at least one of an NFET strain (PMDL1) mask, a PFET strain (PMDL2), an active diffusion (OD) mask, and a POLY mask.

10. A front end of line database configured by a processor in a mask build system, the front end of line database, the database embodied on a non-transitory medium, wherein contents of the database employed by a fab site, comprising:
   a) a POLY layer defining a GATE reticle;
   b) a second drawn layer denoting at least one substantially planar interconnect;
   c) a third drawn layer denoting holes to connect between the POLY layer defining a GATE reticle and the second drawn interconnect layer, the positions and shapes of geometries of the hole layer being used to affect the preparation of the mask data for the POLY layer defining a GATE reticle; and
   d) a drawn marker defining all sections of the POLY layer defining a GATE reticle which the mask build system is to prepare to correctly handle all design-rule-correct positionings of all the holes as can be drawn within the drawn marker layer, and
   the fab site to build reticles for a fabricated semiconductor device.

11. The front end of line database of claim 10, wherein the front end of line database comprises drawn layers for fabricating front end of line reticles up through and including the contact pattern marker layer.

12. The front end of line database of claim 10, further comprising a programmation database comprising drawn layers for fabricating back end of line reticles including a final contact pattern layer reticle, the programmation database submitted for fabrication subsequent to the front end of line database.

13. The front end of line database of claim 10, wherein the drawn POLY level comprises optical proximity correction (OPC).

14. A method of facilitating mask build, the method comprising:
configuring, by a processor, a base structure database, the base structure database comprising layers for building front end of line (FEOL) reticles up through and including:
  a) a first drawn layer denoting at least one substantially planar interconnect;
  b) a second drawn layer denoting at least one substantially planar interconnect;
  c) a third drawn layer denoting holes to connect between the first drawn interconnect layer and the second drawn interconnect layer, the positions and shapes of geometries of the hole layer being used to affect the preparation of the mask data for the first interconnect layer; and
configuring, by a processor, a programmation database corresponding to the semiconductor device of the base structure database, the programmation database comprising layers for building back end of line (BEOL) reticles including a final contact pattern layer reticle, and further including:
  a drawn marker explicitly selecting and defining all sections of the first drawn interconnect layer which the mask build system is to prepare to correctly handle all design-rule-correct positionings of all the holes as can be drawn within the drawn marker layer.

15. The method of claim 14, further comprising supplying the base structure database to a fabricator, to initiate semiconductor device fabrication prior to supplying the programmation database to the fabricator.

16. The method of claim 14, wherein the base database comprises a drawn POLY layer defining a GATE reticle.

17. The method of claim 16, wherein the drawn POLY layer comprises optical proximity correction (OPC).

18. The method of claim 14, further comprising supplying the programmation database to a fabrication site subsequent to fabrication of that portion of a semiconductor device corresponding to the base database.

19. The method of claim 14, further comprising supplying the programmation database to a fabrication site subsequent to supplying the base database to the fabrication site.

20. The method of claim 14, wherein the contact pattern marker layer, when added to the final contact pattern layer reticle, enables the OPC due to the contact pattern marker layer, to be included in the GATE reticle upon fabrication of the final contact pattern obtained from the programmation database.

21. The method of claim 14, further comprising controlling a placement of potential contact patterns in the contact pattern marker layer CONT_L8R according to predetermined design rules and in order to accommodate a final contact pattern CONT.

22. The method of claim 21, wherein the predetermined design rules comprise at least one of CONT_L8R minimum size, space to CONT that is overhanging POLY, maximum overhang of POLY, POLY minimum overhang of CONT_L8R, CONT max overhang CONT_L8R, and contacts that are later placed in CONT_L8R locations must pass all CONT rules including space and size.

23. A mask build system comprising a program for configuring mask layers and a fabrication site for compiling configured mask layers, the system comprising:
at least one database configured by a system processor, the database comprising drawn layers for fabricating reticles of a semiconductor;
the drawn layers including at least:
  a) a drawn gate layer;
  b) a drawn contact layer; and
  c) a marker layer configured to explicitly select and define all design-rule-correct regions within the contact layer wherein any part of the drawn gate layer is not reworked upon a change of a count and/or change of a position of one or more contacts within those defined regions of the drawn contact layer.

24. The mask build system of claim 23, wherein the drawn contact layer is reworked upon the change of the count and/or change of the position of one or more contacts within those defined regions of the drawn contact layer, but the drawn gate layer is not reworked upon that same change of the count and/or change of the position of one or more contacts within those defined regions of the drawn contact layer.

* * * * *